(12) United States Patent
Kurashige et al.

(10) Patent No.: US 11,274,801 B2
(45) Date of Patent: Mar. 15, 2022

(54) ILLUMINATION DEVICE USING COHERENT LIGHT SOURCE

(71) Applicant: DAI NIPPON PRINTING CO., LTD., Tokyo (JP)

(72) Inventors: Makio Kurashige, Tokyo (JP); Shumpei Nishio, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/159,276

(22) Filed: Jan. 27, 2021

(65) Prior Publication Data

US 2021/0148534 A1 May 20, 2021

Related U.S. Application Data

(63) Continuation of application No. 15/757,675, filed on Mar. 6, 2018, now Pat. No. 10,941,915, which is a (Continued)

(30) Foreign Application Priority Data

Sep. 7, 2015 (JP) ................................. 2015-175871
May 2, 2016 (JP) ................................. 2016-092704

(51) Int. Cl.
*G02B 5/00* (2006.01)
*G02B 5/32* (2006.01)
(Continued)

(52) U.S. Cl.
CPC ................ *F21S 41/16* (2018.01); *B60Q 1/14* (2013.01); *F21S 41/00* (2018.01); *F21S 41/285* (2018.01);
(Continued)

(58) Field of Classification Search
CPC ........ F21S 41/675; F21S 41/16; G02B 26/10; G02B 5/32; B60Q 1/04
See application file for complete search history.

(56) References Cited

U.S. PATENT DOCUMENTS

| 6,081,381 A | 6/2000 | Shalapenok et al. |
| 2006/0033009 A1 | 2/2006 | Kobayashi et al. |

(Continued)

FOREIGN PATENT DOCUMENTS

| DE | 102008022795 A1 | 11/2009 |
| EP | 3216650 A1 | 9/2017 |

(Continued)

OTHER PUBLICATIONS

Japanese Office Action dated Jun. 16, 2017 for the corresponding Japanese Patent Application No. 2017-0521608.
(Continued)

*Primary Examiner* — Karabi Guharay
(74) *Attorney, Agent, or Firm* — Michael Best & Friedrich LLP

(57) ABSTRACT

The invention provides a structurally simple illumination device capable of safely illuminating the desired area with coherent light. An illumination device (1) includes a laser light source (11) (coherent light source), a light diffuser (14), and a light scanning device (21). The laser light source (11) emits laser beam L (coherent light). The light diffuser (14) diffuses the laser beam L emitted from the laser light source (11). The light scanning device (21) guides the laser beam L to one of the illumination subareas constituting part of an illumination area, thereby scanning the laser beam L radiated from the light diffuser (14) across the illumination area.

2 Claims, 9 Drawing Sheets

Related U.S. Application Data continuation of application No. PCT/JP2016/076303, filed on Sep. 7, 2016.

(51) Int. Cl.

| | | |
|---|---|---|
| *F21S 41/16* | (2018.01) | |
| *F21S 41/00* | (2018.01) | |
| *B60Q 1/14* | (2006.01) | |
| *G02B 26/10* | (2006.01) | |
| *H01S 5/00* | (2006.01) | |
| *F21S 41/30* | (2018.01) | |
| *F21S 41/675* | (2018.01) | |
| *F21S 41/20* | (2018.01) | |
| *F21V 23/00* | (2015.01) | |
| *H01S 5/40* | (2006.01) | |
| *H01S 5/062* | (2006.01) | |
| *H01S 5/02251* | (2021.01) | |
| *B60Q 1/04* | (2006.01) | |
| *G02B 27/14* | (2006.01) | |
| *G02B 27/30* | (2006.01) | |

(52) U.S. Cl.
CPC ............ *F21S 41/30* (2018.01); *F21S 41/675* (2018.01); *F21V 23/003* (2013.01); *G02B 5/32* (2013.01); *G02B 26/10* (2013.01); *H01S 5/005* (2013.01); *H01S 5/0071* (2013.01); *B60Q 1/04* (2013.01); *G02B 27/141* (2013.01); *G02B 27/149* (2013.01); *G02B 27/30* (2013.01); *H01S 5/02251* (2021.01); *H01S 5/06216* (2013.01); *H01S 5/4087* (2013.01)

(56) References Cited

U.S. PATENT DOCUMENTS

| | | |
|---|---|---|
| 2009/0046474 A1 | 2/2009 | Sato et al. |
| 2010/0202725 A1 | 8/2010 | Popovich et al. |
| 2011/0043876 A1 | 2/2011 | Kurashige et al. |
| 2011/0317130 A1 | 12/2011 | Gollier |
| 2014/0347633 A1 | 11/2014 | Otani |

FOREIGN PATENT DOCUMENTS

| | | | |
|---|---|---|---|
| EP | 3228500 A1 | 10/2017 | |
| EP | 3312498 A1 | 4/2018 | |
| EP | 3312499 A1 | 4/2018 | |
| JP | 2009-169012 A | 7/2009 | |
| JP | 2010-205445 A | 9/2010 | |
| JP | 2011-002547 A | 1/2011 | |
| JP | 2012-146621 A | 8/2012 | |
| JP | 2013-210487 A | 10/2013 | |
| JP | 2013-222058 A | 10/2013 | |
| JP | 2014-016396 A | 1/2014 | |
| JP | 2015-132797 A | 7/2015 | |
| WO | WO-2007119723 A1 * | 10/2007 | ............ G02B 27/48 |

OTHER PUBLICATIONS

International Search Report dated Dec. 13, 2016 for the corresponding International Application No. PCT/JP2016/076303.
Written Opinion of the International Searching Authority dated Dec. 13, 2016 for the corresponding International Application No. PCT/JP2016/076303.
European search report dated Apr. 17, 2019 for the corresponding European Application No. 16844392.7.
Chinese Office Action dated Dec. 10, 2019 for the corresponding Chinese patent application No. 201680050686.2, with machine English translation.
Japanese Office Action dated Jul. 21, 2020 for the corresponding Japanese Patent Application No. 2017-197090, with English tranlation.

* cited by examiner

ILLUMINATION DEVICE USING COHERENT LIGHT SOURCE

CROSS-REFERENCE TO RELATED APPLICATIONS

This application is a continuation of U.S. patent application Ser. No. 15/757,675, filed on Mar. 6, 2018 now U.S. Pat. No. 10,941,915, which, in turn, is a national phase entry of PCT Application No. PCT/JP2016/076303, filed on Sep. 7, 2016, which claims the priority from Japanese Patent Application No. 2015-175871, filed on Sep. 7, 2015, and Japanese Patent Application No. 2016-092704, filed on May 2, 2016 in the Japanese Patent Office, the entire contents of which are hereby incorporated by reference into this application.

TECHNICAL FIELD

The present invention relates to an illumination device for illuminating a predetermined range with coherent light.

BACKGROUND ART

Laser light sources have longer life spans and consume less power than high-pressure mercury lamps, and their associated optical systems can be reduced in size. Thus, illumination devices using laser light sources are being widely used.

Patent Document 1 discloses a vehicle light capable of using a laser oscillator as a light source. The vehicle light includes a hologram element. Stored on this hologram element is a hologram pattern calculated such that diffracted light regenerated by irradiating the hologram element with reference light forms a light distribution pattern of a given light intensity distribution.

CITATION LIST

Patent Literature

Patent Document 1: JP-A-2012-146621

SUMMARY OF INVENTION

Technical Problem

By combining an optical element such as a hologram element with a laser light source as in the above for use, the desired area can be irradiated with coherent light such as laser beam. Illumination devices using coherent light can be applied to devices in various fields. For example, they can be used for vehicle headlights.

Meanwhile, there is a demand for sectioning an illumination area into many illumination subareas to achieve fine illumination of the illumination area or for illuminating part of or the entire illumination area by the densely packed illumination subareas. However, in a system combining a hologram element and a laser light source, generally, as the number of illumination subareas increases, the number of hologram elements needs to be increased. Thus, a preferred system is one capable of safely irradiating densely packed illumination subareas with coherent light using an illumination device having a structure not dependent on the number of light diffusers such as holograms.

A laser light source capable of emitting coherent light is also capable of emitting a laser beam with a minute light-emitting area but with more powerful energy compared with lamp light sources or LEDs (light emitting diodes), and has advantages such that it can control the distribution of the light more finely, and transmit the light farther. However, the coherent light from a laser light source, the etendue of which, or the product of the light emitting surface area (cross-sectional area of the light beam) and the radiation angle (solid angle), is very small, has the chance of the light power density increasing locally. When such coherent light is applied to illumination devices such as vehicle headlights that persons may look at directly, it is necessary to ensure safety.

The invention has been contrived in view of the above, and an object of the invention is to provide a structurally simple illumination device capable of illuminating the desired area safely with coherent light.

Solution to Problem

One aspect of the invention is directed to an illumination device comprising: a coherent light source which emits coherent light; a light diffuser which diffuses the coherent light from the coherent light source; and a light scanning device which scans the coherent light from the light diffuser in an illumination area so as to guide the coherent light to illumination subareas constituting parts of the illumination area.

According to this aspect, a desired illumination subarea can be illuminated safely with coherent light using a structurally simple illumination device.

The illumination device may further comprise a control unit which controls an incident timing of the coherent light to the light diffuser or a timing of illuminating the illumination area.

The illumination device may further comprise a timing control unit which controls a timing of emitting the coherent light according to scanning of the coherent light performed by the light scanning device.

The light scanning device may include: an irradiation surface which is irradiated with the coherent light from the light diffuser and changes a path of the coherent light; and a scan drive unit which adjusts an arrangement of the irradiation surface, and wherein a diffusion angle of the coherent light diffused by the light diffuser is smaller than an angle of each of the illumination subareas relative to the irradiation surface.

According to this aspect, 'the diffusion angle of the coherent light diffused by the light diffuser' is included in an appropriate range that is based on 'the angle of each of the illumination subareas relative to the irradiation surface'.

The diffusion angle of the coherent light diffused by the light diffuser may be larger than 0.05° and smaller than 2°.

According to this aspect, the illumination subareas having broadness can be illuminated appropriately while controlling the diffusion of the coherent light by the light diffuser to a proper range. Thus, it is not necessary to provide an optical element for reducing the diffusion angle of the coherent light increased by the light diffuser, which leads to a structurally simple and compact illumination device.

The angle of each of the illumination subareas relative to the irradiation surface of the light scanning device may be larger than 0.1° and smaller than 5°.

According to this aspect, the illumination subareas can be irradiated appropriately with the coherent light whose diffusion angle is controlled to a proper range by the light diffuser.

The light scanning device may be disposed at a position that is based on an imaging position of the coherent light from the light diffuser.

The light scanning device can be disposed at the position that agrees with the position of the imaging position of the coherent light from the light diffuser or can be disposed near the imaging position. When the light scanning device is disposed at the position that agrees with the position of the imaging position of the coherent light from the light diffuser, the light diffuser can be regarded as being disposed at the position of the light scanning device.

The light diffuser may be a hologram.

The light diffuser may be a micro-lens array.

According to this aspect, the diffusion of the coherent light by the light diffuser can be controlled with ease to a proper range.

The illumination device may further comprises a relay optical system disposed between the light diffuser and the light scanning device, wherein the coherent light from the light diffuser is guided to the light scanning device through the relay optical system.

According to this aspect, the arrangement position of the light scanning device and the irradiation area irradiated with the coherent light can be controlled by the relay optical system, and the above illumination device can be applied flexibly to various types of light scanning devices.

The illumination device may further comprise a beam expander which is disposed between the coherent light source and the light diffuser and expands a diameter of the coherent light from the coherent light source.

According to this aspect, the light entrance area of the coherent light for the light diffuser can be optimized by the beam expander.

The illumination device may further comprise a collimating optical system which is disposed between the beam expander and the light diffuser and collimates the coherent light from the beam expander.

According to this aspect, the diffusion of the coherent light by the light diffuser can be controlled with ease to a proper range.

A plurality of the coherent light sources which emit coherent lights having mutually different wavelengths may be provided, a plurality of the light diffusers which are correspondingly provided for the coherent light sources respectively may be provided and each diffuse the coherent light from corresponding one of the coherent light sources, and the illumination device may further comprise an optical guide unit which guides to the light scanning device the coherent lights having mutually different wavelengths from the plurality of light diffusers.

The optical guide unit may include: a first optical guide member disposed between one light diffuser of the plurality of light diffusers and the light scanning device; and a second optical guide member which guides to the first optical guide member the coherent light from another light diffuser of the plurality of light diffusers, and wherein the first optical guide member guides to the light scanning device the coherent light from the one light diffuser and the coherent light from the another light diffuser.

A plurality of the coherent light sources which emit coherent lights having mutually different wavelengths may be provided, and the illumination device may further comprise an optical guide unit which guides to the light diffuser the coherent lights having mutually different wavelengths from the plurality of coherent light sources.

The optical guide unit may include: a first optical guide member disposed between one coherent light source of the plurality of coherent light sources and the light diffuser; and a second optical guide member which guides to the first optical guide member the coherent light from another coherent light source of the plurality of coherent light sources, and wherein the first optical guide member guides to the light diffuser the coherent light from the one coherent light source and the coherent light from the another coherent light source.

The illumination device may further comprise a plurality of collimating optical systems which are correspondingly provided for the plurality of coherent light sources respectively, each of the collimating optical systems collimating the coherent light from corresponding one of the coherent light sources, wherein the optical guide unit guides to the light diffuser the coherent lights which have been emitted from the plurality of coherent light sources and have passed through the plurality of collimating optical systems, the coherent lights having mutually different wavelengths.

The illumination device may further comprises a collimating optical system which collimates the coherent lights having mutually different wavelengths, wherein the optical guide unit emits the coherent lights having mutually different wavelengths from the plurality of coherent light sources toward the collimating optical system, so as to guide the coherent lights to the light diffuser.

The illumination device may further comprises a beam expander which expands diameters of the coherent lights, wherein the optical guide unit guides the coherent lights having mutually different wavelengths from the plurality of coherent light sources to the light diffuser via the beam expander and the collimating optical system.

Another aspect of the invention is directed to an illumination device comprising: a coherent light source which emits coherent light; a light scanning device which changes a propagation direction of the coherent light from the coherent light source; and a light diffuser which diffuses the coherent light from the light scanning device, wherein the light scanning device scans the coherent light having passed through the light diffuser in an illumination area so as to guide the coherent light to illumination subareas constituting parts of the illumination area.

The coherent light which is changed in the propagation direction by the light scanning device may have light components having mutually different wavelengths, a spectroscopic unit may be provided between the light scanning device and the light diffuser, the coherent light from the light scanning device may be incident on the light diffuser via the spectroscopic unit, and the spectroscopic unit may spectrally disperse the coherent light from the light scanning device into a plurality of light components having wavelengths different from each other and emits the plurality of light components toward the light diffuser.

The spectroscopic unit may include: a first spectroscopic guide member which allows a light component in a first wavelength range to pass therethrough and guide the light component to the light diffuser, while reflecting light components in other wavelength ranges; and a second spectroscopic guide member which guides the light components in the other wavelength ranges reflected by the first spectroscopic guide member to the light diffuser.

Advantageous Effects of the Invention

According to the invention, a structurally simple illumination device can be achieved. In addition, a desired area can be illuminated safely with coherent light.

DESCRIPTION OF EMBODIMENTS

Figure 1:
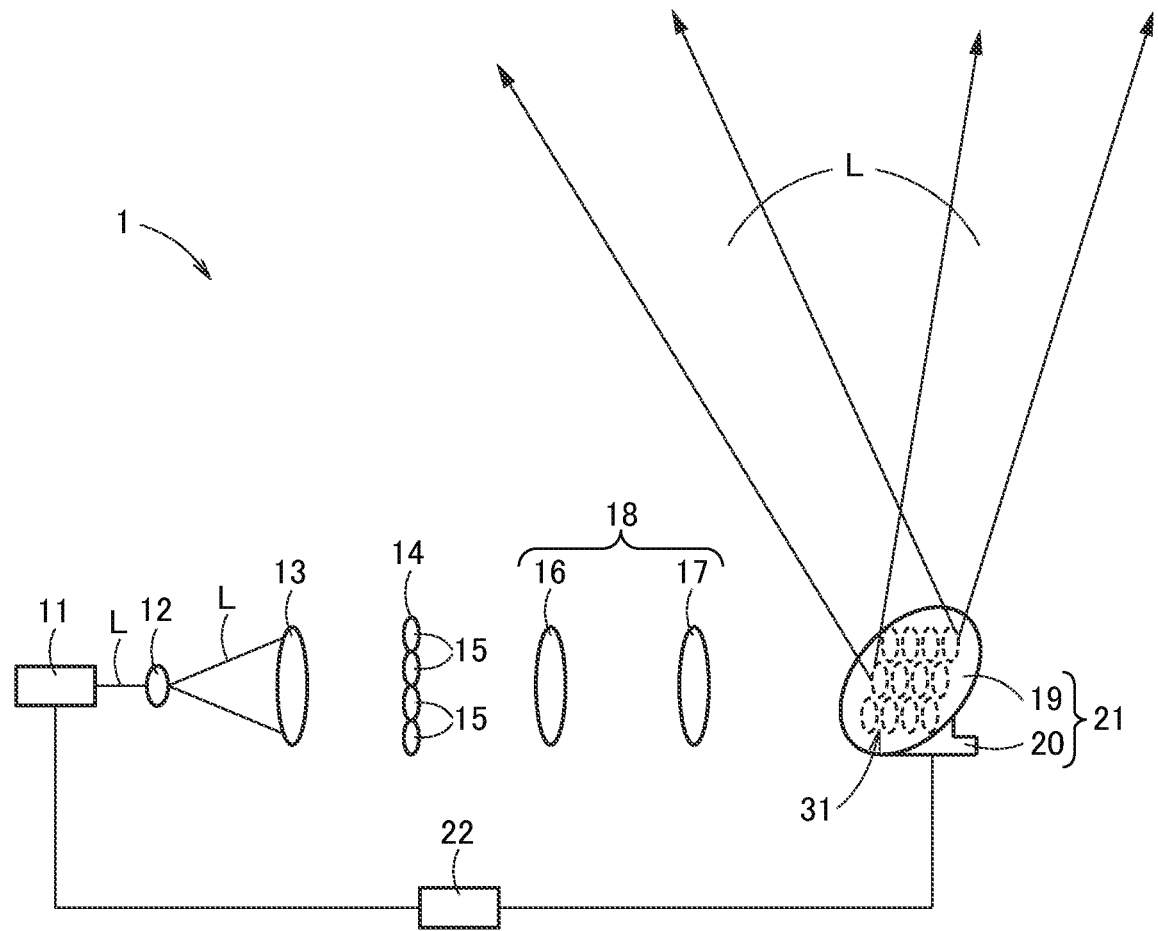
FIG. 1 is a conceptual diagram illustrating an outline of a structure of an illumination device according to Embodiment 1 of the invention.

Embodiments of the present invention will now be described with reference to the accompanying drawings. In the drawings appended to the specification, for illustration and clarification purposes, the actual scales or proportions of dimensions are changed or exaggerated.

In this specification, words that specifies shapes, geometric conditions, or the degrees of such traits, such as words like 'parallel,' 'perpendicular,' and 'identical' and the values of lengths and angles, are to be interpreted not in their strict meanings but to include ranges that would achieve similar functions.

Embodiment 1

FIG. 1 is a conceptual diagram illustrating an outline of a structure of an illumination device 1 according to Embodiment 1 of the invention.

The illumination device 1 of the present embodiment includes a laser light source 11, a beam expander 12, a collimating optical system 13, a light diffuser 14, a relay optical system 18, and a light scanning device 21.

The laser light source 11 is a source of laser beams, that is, coherent light L. Typically, the laser light source 11 is a semiconductor laser light source. The laser light source 11 can consist of one or more light sources. When the laser light source 11 consists of multiple light sources, the spectrums of the laser beams L emitted from the light sources can be the same or different. To increase the illumination intensity of the laser beam L emitted from the laser light source 11, it is preferred that the spectrums of the laser beams L emitted from multiple light sources overlap one another. When the laser beams L emitted from the multiple light sources constituting the laser light source 11 have different spectrums, the multiple light sources can be provided independently of one another or arranged on a common substrate to form a light source module. For example, when the multiple light sources constituting the laser light source 11 are capable of emitting laser beams L with red, green, and blue spectrums, overlapping the three laser beams L results in white illumination light.

The laser light source 11 can include a light emission control unit (not illustrated) for controlling the emission of laser beam. The light emission control unit is controlled by a light emission timing control unit 25, described later. The light emission control unit can, for example, separately control the timings of emitting laser beams having different spectrums. In other words, when multiple light sources are provided to produce laser beams with different spectrums, the light emission control unit can control for each light source the timings at which laser beams are emitted from the multiple light sources. Thus, when the laser light source 11 is capable of emitting red, green, and blue laser beams, controlling the timings of emitting the laser beams produces a red, green, or blue light or lights of mixed colors obtained by mixing two or more of the colors. The light emission control unit can also control the emission intensities of the laser beams from the light sources, thereby emitting a high or low intensity laser beam from each of the light sources.

The beam expander 12 is disposed between the laser light source 11 and the light diffuser 14. In the present embodiment, it is disposed between the laser light source 11 and the collimating optical system 13 to expand the diameter of the laser beam L from the laser light source 11. The collimating optical system 13 is disposed between the beam expander 12 and the light diffuser 14 to collimate the light from the beam expander 12. Thus, the small-diameter laser beam L emitted from the laser light source 11 is expanded in diameter by the beam expander 12 and collimated by the collimating optical system 13, thereby being optimized for the size of the input section of the later-stage light diffuser 14 before entering the light diffuser 14. In FIG. 1, for illustration and clarification purposes, the laser beam L is not illustrated in the section from the collimating optical system 13 to the light scanning device 21.

The light diffuser 14 consists of multiple diffuser elements 15 and diffuses the laser beam L from the laser light source 11. As will be described later in detail, in the present embodiment, it is preferred that the light diffuser 14 be a high-directivity optical element capable of diffusing the laser beam L at a relatively gentle angle. Such a light diffuser 14 element is typically a micro-lens array; in that case, the micro-lenses that form the array each constitute one of the diffusing elements 15. The light diffuser 14 can also be a hologram recording medium. Specifically, examples of hologram recording media include computer generated holograms (CGH) and Fourier transform holograms. Further examples include volume hologram recording media using photopolymers, volume hologram recording media that are photosensitive media including silver halide materials, and relief (embossed) hologram recording media.

The structure and effects of the light diffuser 14 are described later in detail.

Figure 3:
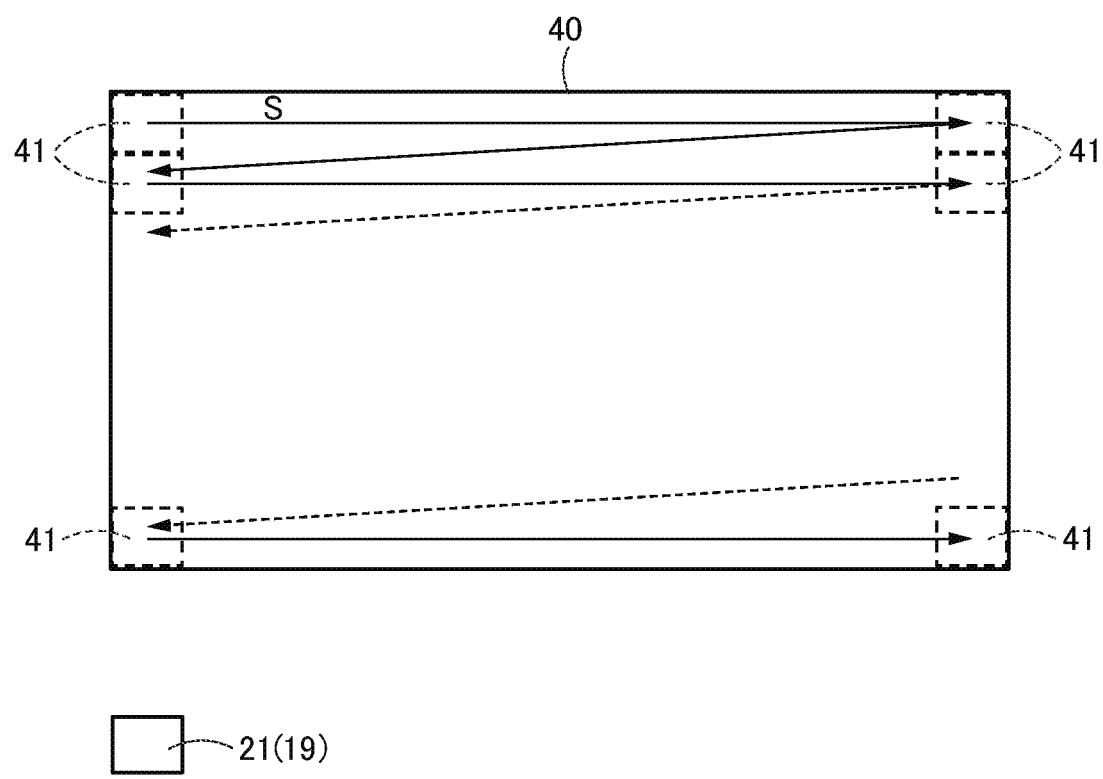
FIG. 3 is a conceptual diagram illustrating an illumination area of a laser beam guided by a light scanning device.

The relay optical system 18 is disposed between the light diffuser 14 and the light scanning device 21. In the present embodiment, the relay optical system 18 includes a first relay lens 16 and a second relay lens 17. The laser beam L from the light diffuser 14 is guided through the relay optical system 18 to the light scanning device 21, whereby an image is formed on an irradiation surface 19 of the light scanning device 21. In the present embodiment, the image of the light diffuser 14, that is, the image of a virtual micro-lens array 31, is formed on the irradiation surface 19 of the light scanning device 21. The virtual micro-lens array 31 formed on the irradiation surface 19 of the light scanning device 21 can be treated as a virtual light source; in that case, it follows that, as illustrated in FIG. 3, the laser beam L from the virtual micro-lens array 31 irradiates the individual illumination subareas 41 included in an entire illumination area 40.

The relay optical system 18 is not limited to particular structures. By controlling the optical characteristics of the optical elements constituting the relay optical system 18, that is, adjusting the focal distances of the first relay lens 16 and the second relay lens 17, the relay optical system 18 can be made to function as an unmagnification optical system, magnification optical system, or de-magnification optical system. For example, by forming the relay optical system 18 using a first relay lens 16 and a second relay lens 17 with the same focal distances, the optical magnification of the relay optical system 18 can be set to 1 (unmagnification). On the other hand, by forming the relay optical system 18 using a first relay lens 16 and a second relay lens 17 with different focal distances, the optical magnification of the relay optical system 18 can be changed (magnification or de-magnification) according to the ratio of the focal distances of the two lenses. As above, by making the relay optical system 18 an afocal system, it is double telecentric, which fixes the height of an image formed on the light emission side. As a result, the influence of the irradiation area of the light diffuser 14 on the illumination area in a distant field of view becomes considerably small, and highly precise illumination can be performed. It is to be noted that when the relay optical system 18 is a de-magnification optical system, the diffusion angle of the laser beam L diffused from the light scanning device 21 becomes relatively large. When the relay optical system 18 is a magnification optical system, the diffusion angle of the laser beam L diffused from the light scanning device 21 becomes relatively small.

In the present embodiment, as will be described later in detail, by irradiating the irradiation surface 19 of the light scanning device 21 with the laser beam L passing through the light diffuser 14, the individual illumination subareas 41 included in the entire illumination area 40 are illuminated with the laser beam L. Thus, by adjusting with the relay optical system 18 'the irradiation range (irradiation area) of the irradiation surface 19 of the light scanning device 21,' irradiated with the laser beam L from the light diffuser 14, the appropriate range (area) of the irradiation surface 19 is irradiated with the laser beam L.

The light scanning device 21 includes the irradiation surface 19 irradiated with the laser beam L from the light diffuser 14 and a scan drive unit 20 that adjusts the arrangement of the irradiation surface 19. As illustrated in FIG. 3, the laser beam L from the light diffuser 14 is scanned across the illumination area 40 to guide the laser beam L to the individual illumination subareas 41 that constitute part of the illumination area. In other words, the irradiation surface 19 changes the path of the laser beam L radiated and guides the light L to the individual illumination subareas 41 included in the entire illumination area 40. The scan drive unit 20 is connected to a controller 22. Controlled by the controller 22, the scan drive unit 20 adjusts the facing direction of the irradiation surface 19, thereby changing the individual illumination subareas 41 in the illumination area 40 to be irradiated with the laser beam L. The irradiation surface 19 can be a mirror, examples of which include a MEMS (micro electro mechanical systems) mirror such as a polygon mirror, a two-shaft galvanometer mirror, and a resonance mirror and a two-shaft large-diameter resonance mirror with a reflective surface of several tens of millimeters (mm) diameter.

Instead of using the above light scanning device with a mirror, it is also possible to scan the laser beam by making oscillate a light transparent member such as a lens, an example of which is a Fresnel lens. When a laser beam is incident on a Fresnel lens, it passes through the lens and is then scanned across the irradiation area. When the light scanning device uses a Fresnel lens, the laser beam emission surface of the lens serves as the irradiation surface 19.

The light scanning device 21, especially the irradiation surface 19, is disposed at the position that is based on the imaging position of the laser beam L passing through the light diffuser 14. As stated above, in the present embodiment, the laser beam L emitted through the individual diffusing elements 15 of the light diffuser 14 irradiates the irradiation surface 19 of the light scanning device 21 through the relay optical system 18. Thus, in the present embodiment, the arrangement position of the light scanning device 21 is determined based on the imaging position determined in accordance with the optical characteristics (focal distances) of the individual diffusing elements 15 of the light diffuser 14 and the optical characteristics (focal distance) of the relay optical system 18. When the relay optical system 18 is not provided, the arrangement position of the irradiation surface 19 of the light scanning surface 21 is preferably determined based on the imaging position determined in accordance with the optical characteristics (focal distances) of the individual diffusing elements 15 of the light diffuser 14.

The phrase 'the position that is based on the imaging position of the laser beam L passing through the light diffuser 14' used herein typically refers to the position that agrees with the imaging position, but they do not necessarily need to precisely agree with each other. Instead, the irradiation surface 19 of the light scanning device 21 can also be disposed near an area in which the influence on imaging performance can be tolerated, for example, near 'the imaging position of the laser beam L passing through the light diffuser 14.'

The controller 22 is connected to the laser light source 11 and the light scanning device 21, especially the scan drive unit 20 of the light scanning device 21, and performs on/off control for the emission of the laser beam L from the laser light source 11 and control for the scanning of the laser beam L by the irradiation surface 19 of the light scanning device 21. In place of the on/off control for the light emission from the laser light source 11, it is also possible to provide a light shutting section, not illustrated, between the laser light source 11 and the light diffuser 14 and use the light shutting section to permit or not to permit the emission of the laser light source. In either case, the controller 22 controls the timing of the laser beam incident on the light diffuser 14 and the timing of illuminating the illumination area.

Figure 2:
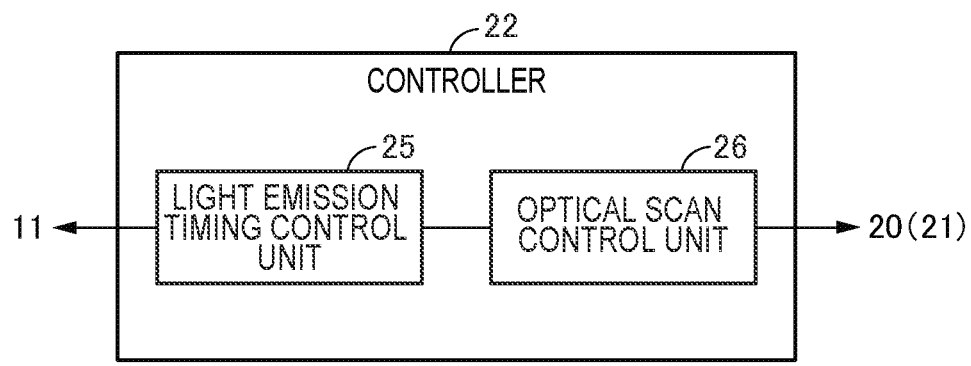
FIG. 2 is a block diagram illustrating an example of a functional structure of a controller.

FIG. 2 is a block diagram illustrating a functional structure of the controller 22. The controller 22 includes the light emission timing control unit 25 for controlling the laser light source 11 and an optical scan control unit 26 for controlling the scan drive unit 20 of the light scanning device 21.

In cooperation with the an optical scan control unit 26, the light emission timing control unit 25 of the present embodiment controls the timing of the emission of the laser beam L based on the scanning of the laser beam L by the light scanning device 21. This allows, as illustrated in FIG. 3, only part of the areas within the entire illumination area 40 to be or not to be illuminated with the laser beam L.

FIG. 3 is a conceptual diagram illustrating the illumination area 40 illuminated with the laser beam L guided by the light scanning device 21.

In the present embodiment, the laser beam L guided by the light scanning device 21 irradiates the individual illumination subareas 41 constituting part of the illumination area 40. In other words, only one illumination subarea 41 within the illumination area 40 is illuminated with the laser beam L from the laser scanning device 21 at a time. When the entire illumination area 40 is illuminated, the light scanning device 21 scans the laser beam L at high speed within the illumination area 40. The method of scanning the laser beam L by the light scanning device 21 is not particularly limited. For example, it is possible to adopt the raster scan method as illustrated by 'S' in FIG. 3, the Lissajous scan method, or the vector scan method.

How to section the illumination area 40 into the illumination subareas 41 is not also limited. The range that can be illuminated at a time is determined as an individual illumination subarea 41 by the laser beam L from the light scanning device 21. For this reason, each illumination subarea 41 is determined based on the timing of emitting the laser beam L from the laser light source 11, which is controlled by the controller 22, and on the scan position of the laser beam L scanned by the light scanning device 21. Therefore, as illustrated in FIG. 3, it is possible to set the illumination subareas 41 such that they overlap or do not overlap one another or create in the illumination area 40 areas in which some of the individual illumination subareas 41 overlap and areas in which some of the individual illumination subareas 41 do not overlap.

The illumination subareas 41 illuminated with the laser beam L from the light scanning device 21 expand gradually according to the diffusion angle of the laser beam L as they are located farther away from the light scanning device 21. For this reason, the individual illumination subareas 41 constituting the illumination area illuminated by the illumination device 1 are wider at a position located relatively far away from the light scanning device 21 (far field) than at a position relatively close to the light scanning device 21 (near field). Thus, it is often convenient to represent the sizes of the individual illumination subareas by their angular distributions in angular space than by their actual dimensions. The word 'illumination area' used herein also includes their angular ranges in angular space as well as the actual irradiation area irradiated with the laser beam L and the actual illumination ranges.

The structure and effects of the light diffuser 14 of FIG. 1 is described below in detail.

The individual diffusing elements 15 constituting the light diffuser 14 serve as virtual light sources for the laser beams L emitted in a diffused manner from the light diffuser 14. In other words, the laser beams L emitted from the light diffuser 14 can be regarded as being emitted from the virtual light sources.

Generally, when the irradiation intensities of the laser beams L demanded for the illumination area (individual illumination subareas) are the same, the laser beams L emitted from multiple light sources require less light power density and thus safer than the laser beam L emitted from a single light source. In other words, when the same irradiation intensity is required for the laser beam L, directly looking at the laser beams L emitted from multiple light sources with the human eyes has less influence on the eyes when the images of the light sources are formed on the retinas than directly looking at the laser beam L emitted from a single light source. Therefore, as in the present embodiment, by providing the light diffuser 14 including the individual diffusing elements 15 at a stage subsequent to the laser light source 11, the individual illumination subareas 41 constituting the illumination area can be illuminated safely with the laser beam L passing through the light diffuser 14.

As a property of light in an optical system, the law of etendue generally holds true. The law of etendue states that the product of the cross-sectional area (light-emitting area) of a light beam and the solid angle (radiation angle) of its diffused light is maintained at a constant value, and etendue indicates how spread out the light is in area and angle. When the light diffuser 14 is placed on the path of the laser beam L as in the present embodiment, the law of etendue applies to the downstream side of the light diffuser 14 in terms of the propagation direction of the laser beam L, with the 'apparent light source' formed by the light diffuser 14 being used as a reference.

The diffusion angle of the laser beam L diffused by the light diffuser 14 is smaller than the angular space range of an illumination subarea 41, that is, the angle of an illumination subarea 41 with respect to the irradiation surface 19 of the light scanning device 21.

As stated above, from a safety point of view, the larger the area of the light source is, the better it is. However, to reduce the sizes of the individual illumination subareas 41 when the laser beam L is emitted from a light source with a large light-emitting area, the cross-sectional area of the laser beam L needs to be reduced. According to the law of etendue, however, the diffusion angle of the laser beam L increases when the cross-sectional area of the laser beam L decreases, which means that it becomes difficult to illuminate a wide area at proper light intensity. In other words, as the diffusion angle of the laser beam L increases, the optical mechanism that adjusts the diffusion angle of the laser beam L necessary to illuminate the space-limited illumination subareas 41 needs to be larger in size and more complex. Also, to illuminate a wide range with proper light intensity in the propagation direction of the laser beam L guided by the light scanning device 21, it is preferred that the diffusion angle of the laser beam L diffused by the light diffuser 14 that forms the apparent light source be small. Thus, to illuminate a wide portion of each of the space-limited illumination subareas 41 at proper light intensity, it is preferred that the diffusion angle of the laser beam L diffused by the light diffuser 14 be within an appropriate angular range. Such an appropriate angular range is determined by the angular ranges of the individual illumination subareas 41.

Specifically, the diffusion angle of the laser beam L diffused by the light diffuser 14 is preferably larger than 0.05° and smaller than 2°. 'The diffusion angle of the laser beam L diffused by the light diffuser 14 of the present embodiment' is determined by the diffusion angles of the laser beams L diffused by the individual diffusing elements 15 constituting the light diffuser 14, and each of the diffusing elements 15 preferably has a diffusion angle of larger than 0.05° but smaller than 2°. It is also preferred that the angle of each of the illumination subareas 41 relative to the irradiation surface 19 of the light scanning device 21 be larger than 0.1° and smaller than 5°. When the diffusion angle of the laser beam L diffused by the light diffuser 14 and the angular range of each of the illumination subareas 41 are within those ranges, a wide portion of each of the illumination subareas 41 can be illuminated at proper light intensity.

'The diffusion angle of the laser beam L diffused by the light diffuser 14' is measured by irradiating the light diffuser 14 with the laser beam L and is the angle of the collimated laser beam L diffused by the light diffuser 14. 'The angle of each of the illumination subareas 41 relative to the irradiation surface 19 of the light scanning device 21 (the angular range of each of the illumination subareas 41)' is the angle formed by lines connecting a representative point on the irradiation surface 19 of the light scanning device 21 and representative positions of the illumination subareas 41; for example, it is the angle formed by lines connecting one or more representative points on the irradiation surface 19 and two or more representative positions of the illumination subareas 41.

As described above, according to the illumination device 1 of the present embodiment, at the light diffuser 14 having a light diffusion angle within a predetermined range and the illumination area 40, illumination of the illumination subareas 41 by the laser beam L is performed by the scan light scanning device 21 that scans the laser beam L. With this, the illumination device 1 capable of safely illuminating the individual illumination subareas 41 within the illumination area 40 using the laser beam L can be realized. Moreover, a structurally simple illumination device that does not involve complex and costly devices can be achieved.

<Modification 1>

Figure 4:
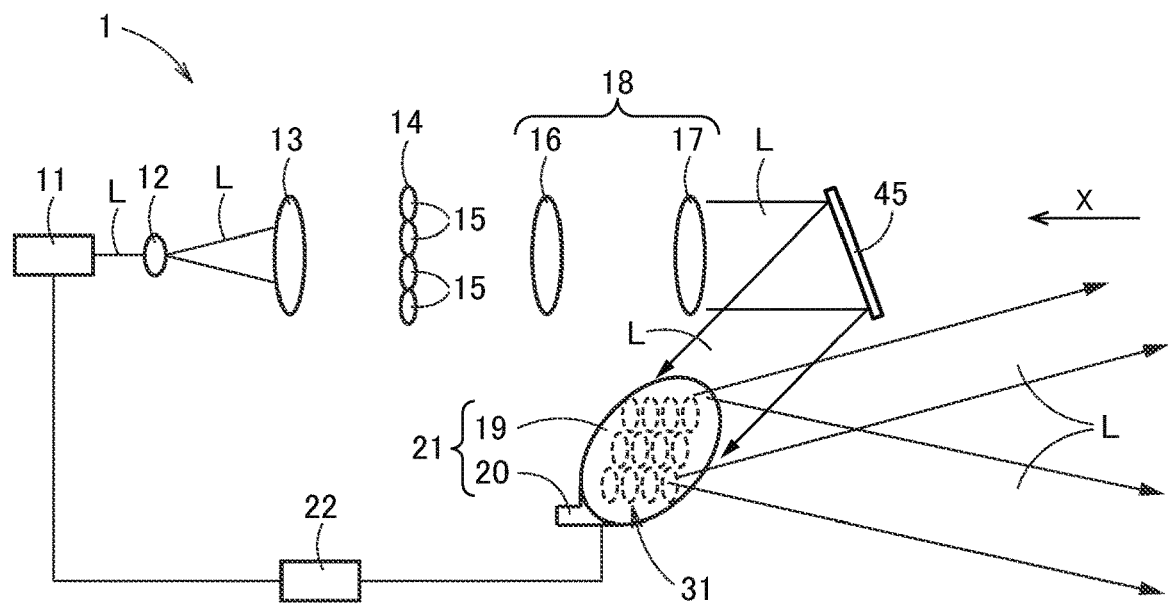
FIG. 4 is a conceptual diagram illustrating an outline of a structure of an illumination device according to Modification 1.

FIG. 4 is a conceptual diagram illustrating an outline of a structure of an illumination device 1 according to modification 1 of the illumination device 1 of FIG. 1. In this modification, a reflective mirror 45 is provided between the second relay lens 17 of the relay optical system 18 and particularly the irradiation surface 19 of the light scanning device 21. The rest is the same as in the above-described illumination device 1 of FIG. 1.

The reflective mirror 45 reflects the laser beam L from the second relay lens 17 of the relay optical system 18 and guides the reflected laser beam L to particularly the irradiation surface 19 of the light scanning device 21. With the use of the reflective mirror 45, the propagation direction of the laser beam L can be changed to the desired direction, and the path of the laser beam L can be optimized flexibly based on spatial demand such as for installation space. Thus, it is possible to arrange the optical systems in a more compact manner when the reflective mirror 45 is used to adjust the laser beam L as in the present modification than when, as with the illumination device 1 of FIG. 1, the optical axis of the laser beam L is bent at a relatively large angle such as at a right angle by the irradiation surface 19 of the light scanning device 21.

The specific structure of the reflective mirror 45 is not particularly limited, and a plane mirror can be used to form the reflective mirror 45. Alternatively, a concave mirror can be used to form the reflective mirror 45, or the reflective mirror 45 can be provided as part of the relay optical system 18. Also, the reflection direction of the laser beam L by the reflective mirror 45 is not particularly limited.

Figure 5:
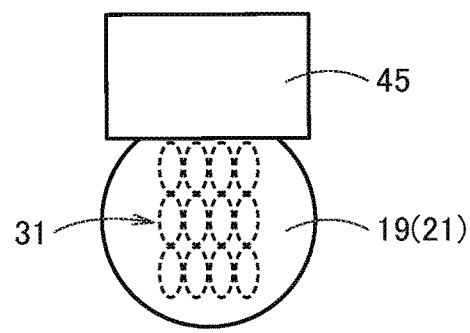
FIG. 5 is a diagram illustrating an example of arrangement of a reflective mirror of the modification of FIG. 4 and an irradiation surface (light scanning device) and shows an configuration example in a case where laser beams are reflected vertically by the reflective mirror.
Figure 6:
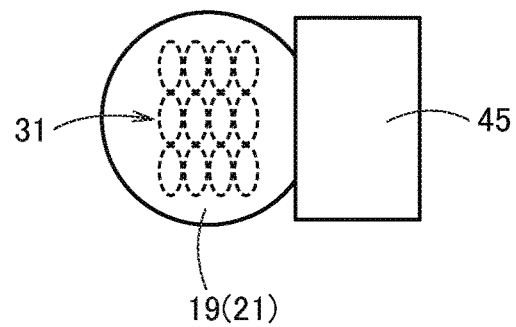
FIG. 6 is a diagram illustrating an example of arrangement of the reflective mirror of the modification of FIG. 4 and the irradiation surface (light scanning device) and shows an configuration example in a case where laser beams are reflected horizontally (laterally) by the reflective mirror.

FIGS. 5 and 6 are diagrams illustrating examples of arrangement of the reflective mirror 45 of the modification of FIG. 4 and the irradiation surface 19 of the light scanning device 21 and are diagrams of the reflective mirror 45 and the irradiation surface 19 as viewed from a front direction (see the arrow 'X' of FIG. 4). FIG. 5 illustrates a case where the laser beam L is reflected vertically by the reflective mirror 45 while FIG. 6 illustrates a case where the laser beam L is reflected horizontally (laterally) by the reflective mirror 45. The direction in which the reflective mirror 45 reflects the laser beam L is not particularly limited, and the reflective mirror 45 can guide the laser beam L in any desired direction. Also, multiple reflective mirrors 45 can be provided, and the reflective mirrors 45 capable of reflecting the laser beam L in different directions can be provided between the second relay lens 17 of the relay optical system 18 and the irradiation surface 19 of the light scanning device 21.

<Modification 2>

Figure 7:
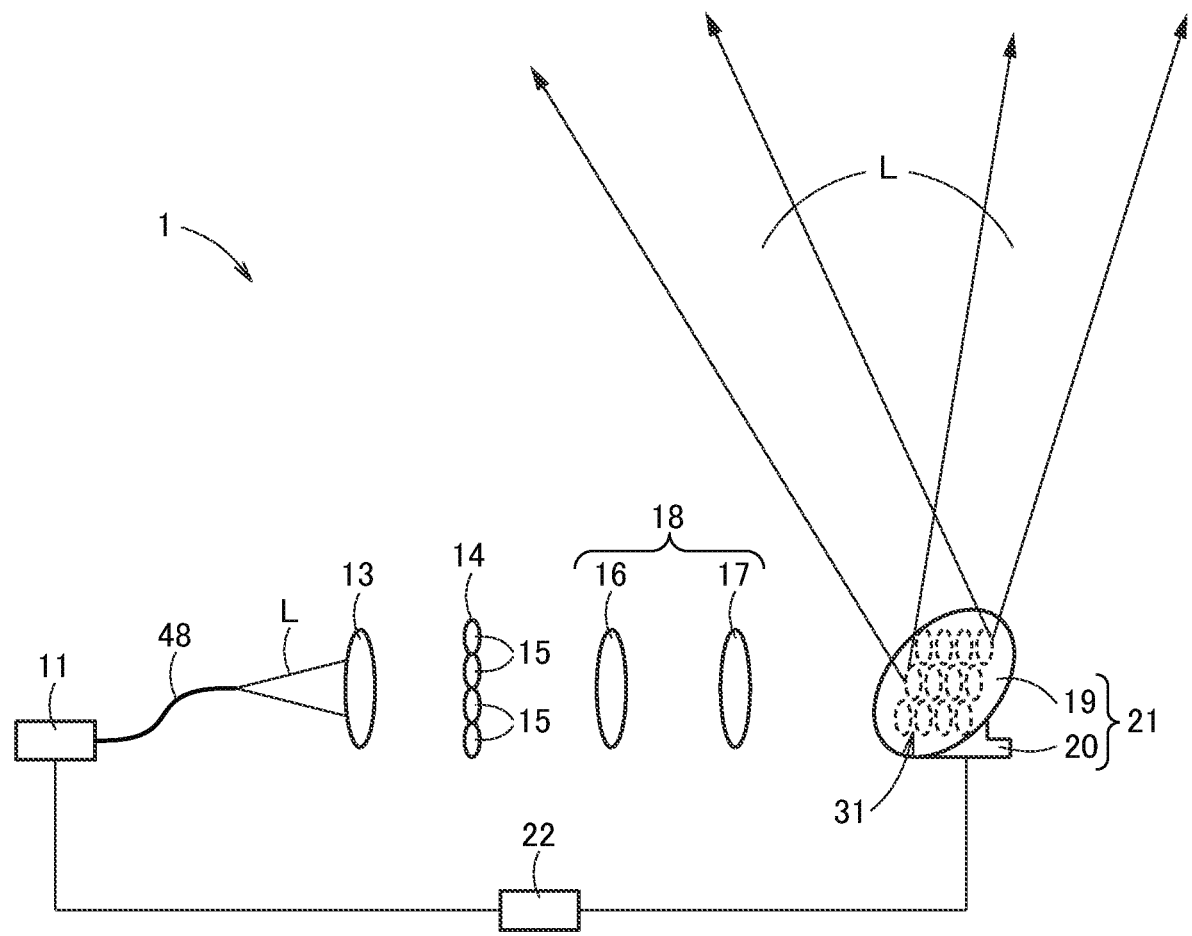
FIG. 7 is a conceptual diagram illustrating an outline of a structure of an illumination device according to Modification 2.

FIG. 7 is a conceptual diagram illustrating the structure of an illumination device 1 according to Modification 2 of the illumination device 1 of FIG. 1. In this modification, in place of the beam expander 12, an optical fiber 48 is provided between the laser light source 11 and the collimating optical system 13. The rest is the same as in the illumination device 1 of FIG. 1.

In this modification, the laser beam L emitted from the laser light source 11 travels from the laser light source 11 directly into the optical fiber 48, and the laser beam L is emitted from the optical fiber 48 toward the collimating optical system 13. The laser beam L emitted from the optical fiber 48 is incident on the collimating optical system 13 in a diffused manner, where it is collimated by the collimating optical system 13.

In this structure, as the diameter of the laser beam L collimated by the collimating optical system 13 is increased relative to the core diameter of the optical fiber 48 (the diameter of the path of the laser beam L), the laser beam L can be collimated more accurately, and the degree of the parallelness of the laser beam L can be increased.

<Modification 3>

Figure 8:
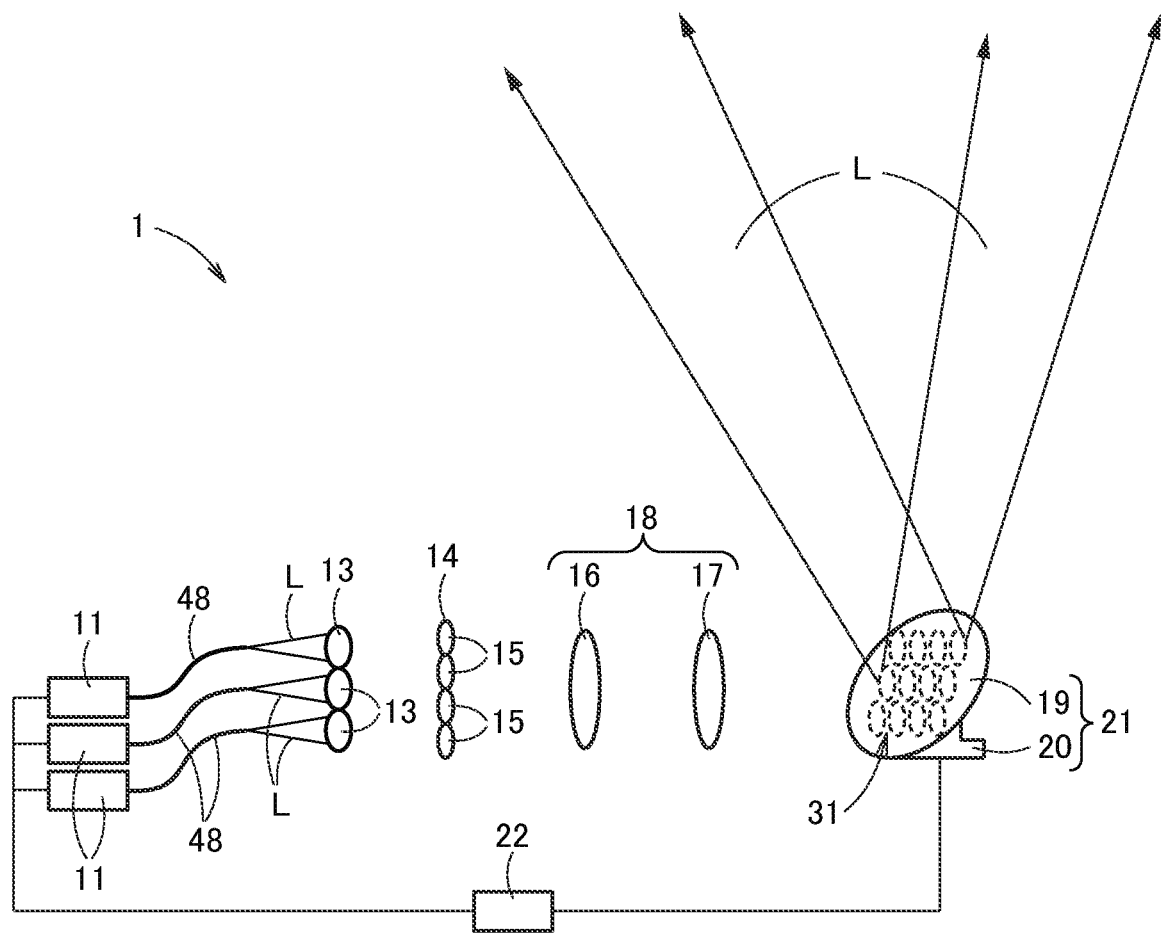
FIG. 8 is a conceptual diagram illustrating an outline of a structure of an illumination device according to Modification 3.

FIG. 8 is a conceptual diagram illustrating an outline of a structure of an illumination device 1 according to Modification 3 of the illumination device 1 of FIG. 1. In this modification, multiple laser light sources 11 are provided, and multiple collimating optical systems 13 are provided. Also, in place of the beam expander 12, multiple optical fibers 48 are provided between the laser light sources 11 and the collimating optical systems 13. The rest is the same as in the above described illumination device 1 of FIG. 1.

In this medication, one of the optical fibers 48 and one of the collimating optical systems 13 are allocated to each of the laser light sources 11. The laser beams L emitted from the laser light sources 11 travel from the laser light sources 11 directly into the associated optical fibers 48. Thereafter, the laser beams L are emitted from the optical fibers 48 to the associated collimating optical systems 13. In this modification as well, similar to Modification 2, the laser beams L emitted from the optical fibers 48 are incident on the collimating optical systems 13 in a diffused manner, where they are collimated by the respective collimating optical systems 13.

By emitting the laser beams L emitted from the multiple laser light sources 11 via the multiple optical fibers 48 as in the present modification, the core diameter of each optical fiber 48 can be reduced if the total output is constant. Thus, variations in the angles of the laser beams L that have passed through the collimating optical systems 13 (collimating optical system array), that is, the angles of the collimated laser beams L, can be reduced, and the collimating optical systems 13 can emit laser beams L that are closer to parallel beams.

Embodiment 2

Figure 9:
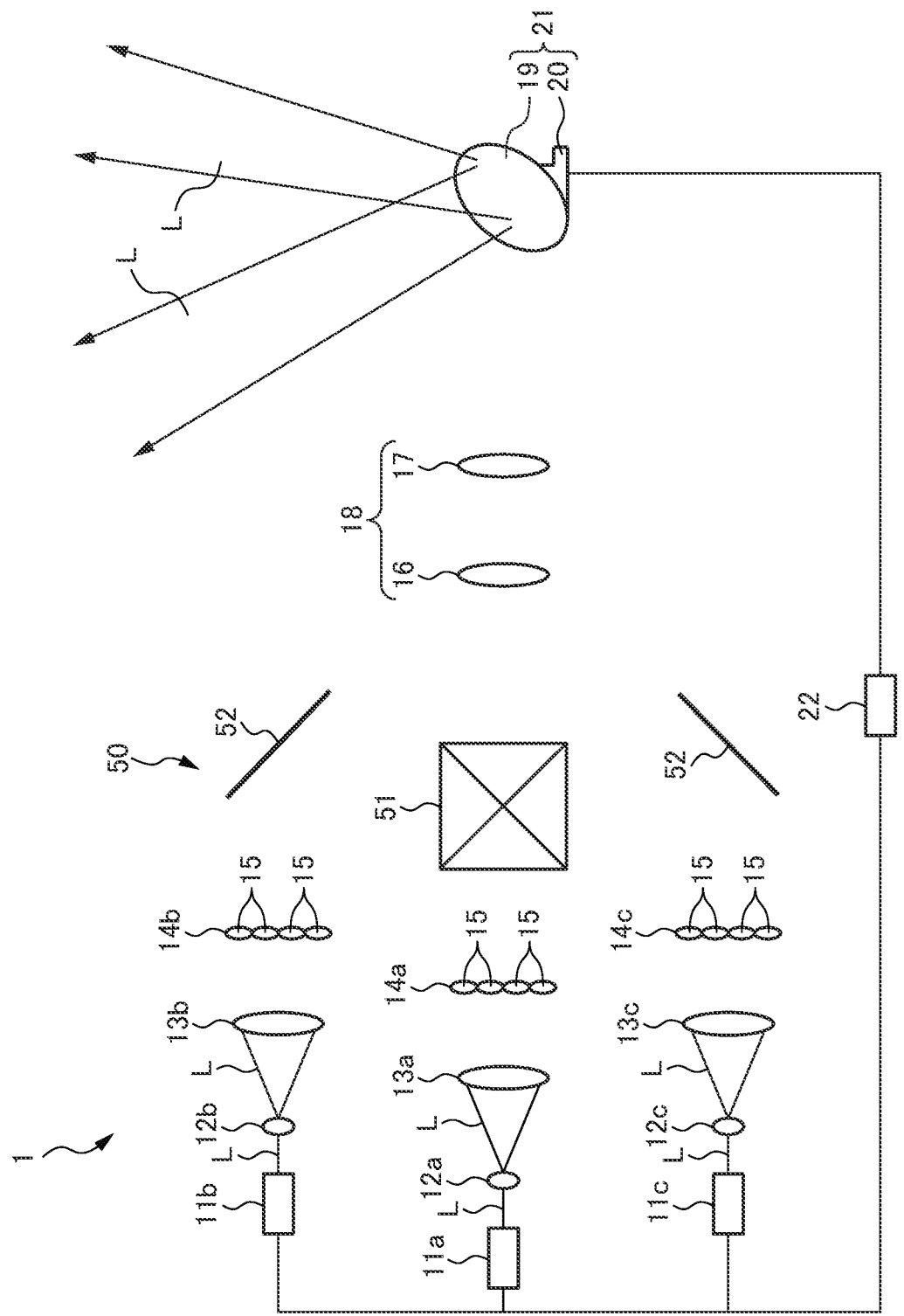
FIG. 9 is a conceptual diagram illustrating an outline of a structure of an illumination device according to Embodiment 2 of the invention.

FIG. 9 is a conceptual diagram illustrating an outline of a structure of an illumination device 1 according to Embodiment 2 of the invention. In this embodiment, the same reference characters are used to refer to elements that are the same as or similar to those used in Embodiment 1, and such elements will not be described further in detail. In FIG. 9, for illustration and clarification purposes, the laser beam L is not illustrated in the section from collimating optical systems 13a, 13b, and 13c to the light scanning device 21.

In the present embodiment, a first laser light source 11a, a second laser light source 11b, and a third laser light source 11c are provided as multiple laser light sources. The first laser light sources 11a, the second laser light sources 11b, and the third laser light source 11c emit laser beams L with mutually different wavelengths.

As multiple light diffusers, a first light diffuser 14a, a second light diffuser 14b, and a third light diffuser 14c are provided. The first light diffuser 14a, the second light diffuser 14b, and the third light diffuser 14c are formed by holograms and provided for the first laser light source 11a, the second laser light source 11b, and the third laser light source 11c, respectively, to diffuse the laser beams L therefrom.

The illumination device 1 further includes an optical guide unit 50 that guides to the light scanning device 21 the laser beams L with mutually different wavelengths from the first light diffuser 14a, the second light diffuser 14b, and the third light diffuser 14c. The optical guide unit 50 includes a first optical guide member 51 and second optical guide members 52.

The first optical guide member 51 is disposed between one of the light diffusers 14a to 14c, in the case of FIG. 9, the first light diffuser 14a, and the light scanning device 21 and has a dichroic mirror. The first optical guide member 51 having a dichroic mirror is also called a dichroic cube and has the property of letting the laser beam L from the first light diffuser 14a pass therethrough while reflecting the laser beams L with the other wavelengths. The second optical guide members 52 have mirrors guiding the laser beams L from the other light diffusers of the light diffuser 14a to 14c, or the second light diffuser 14b and the third light diffuser 14c in FIG. 9, to the first optical guide member 51. The first optical guide member 51 guides via the relay optical system 18 to the light scanning device 21 the laser beam L from the first light diffuser 14a and the laser beams L from the second light diffuser 14b and the third light diffuser 14c via the second optical guide members 52.

Multiple beam expanders and multiple collimating optical systems are also provided. A first beam expander 12a and a first collimating optical system 13a are provided between the first laser light source 11a and the first light diffuser 14a. A second beam expander 12b and a second collimating optical system 13b are provided between the second laser light source 11b and the second light diffuser 14b. A third beam expander 12c and a third collimating optical system 13c are provided between the third laser light source 11c and the third light diffuser 14c. The collimating optical systems 13a to 13c correspondingly provided for the laser light sources 11a to 11c, are used to collimate the laser beams L from the laser light sources.

The light diffusers 14a to 14c each have a light diffusing property suitable for the wavelength of the laser beam L from the corresponding laser light sources 11a to 11c, and the diffusion angles of the laser beams L with different wavelengths are matched by the light diffusers 14a to 14c. Thereafter, the laser beams L with respective wavelengths are synthesized by the first optical guide member 51 and the second optical guide members 52 and guided via the relay optical system 18 to the light scanning device 21. The irradiation surface 19 of the light scanning device 21 is placed at the position that is based on the imaging position of the laser beams L from the light diffusers 14a to 14c. The controller 22 controls the timings of emitting the laser beams L from the laser light sources in cooperation with the scan control by the light scanning device 21.

According to the above-described illumination device 1, any desired illumination subarea 41 of the illumination area 40 can be illuminated safely with the laser beams of different wavelengths. Thus, by emitting laser beams L of red-color, green-color, and blue-color wavelengths from the laser light sources 11a to 11c, the illumination area 40 can be illuminated with full color light.

Embodiment 3

Figure 10:
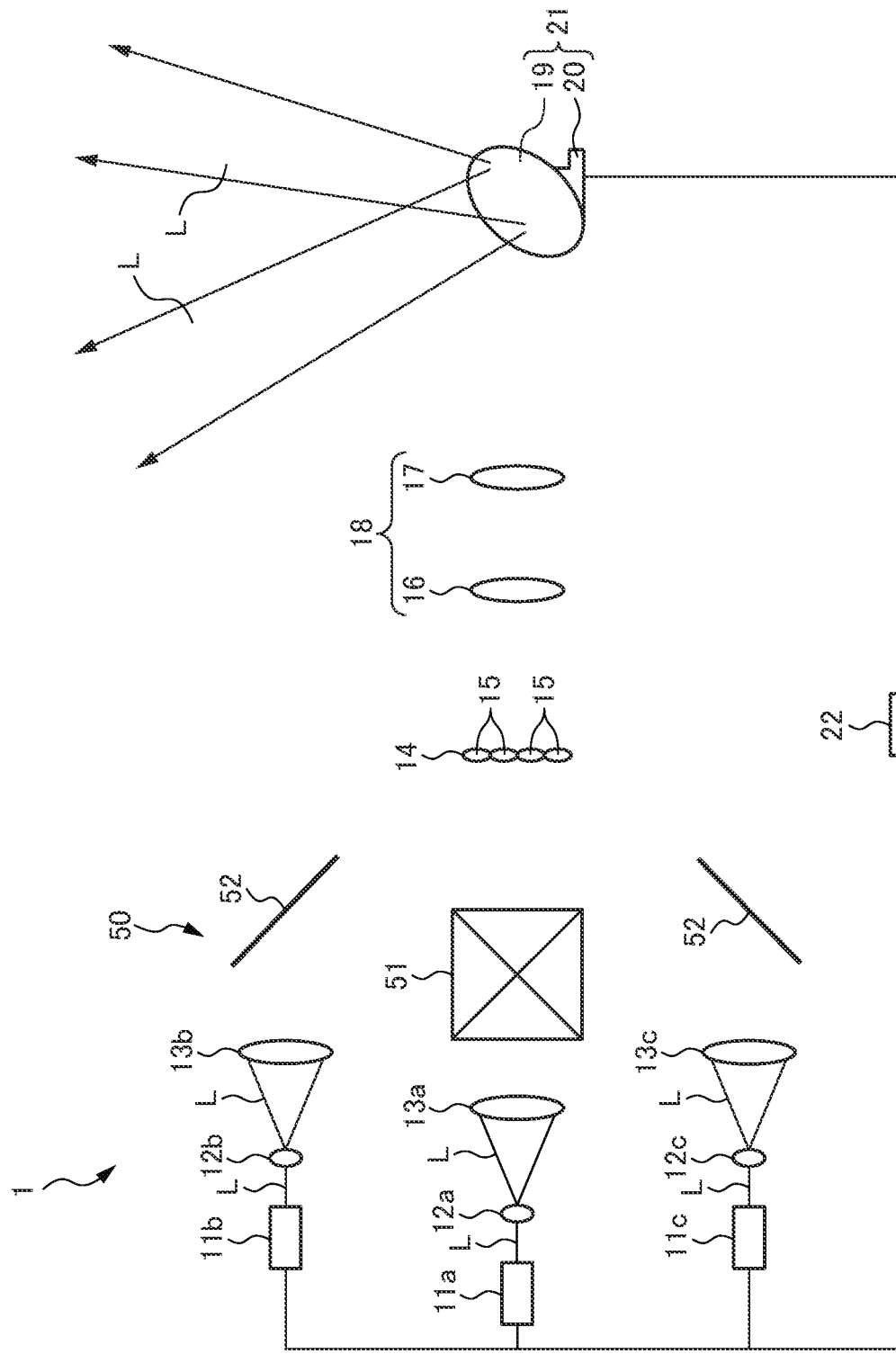
FIG. 10 is a conceptual diagram illustrating an outline of a structure of an illumination device according to Embodiment 3 of the invention.

FIG. 10 is a conceptual diagram illustrating an outline of a structure of an illumination device 1 according to Embodiment 3 of the invention. In this embodiment, the same reference characters are used to refer to elements that are the same as or similar to those used in Embodiment 2, and such elements will not be described further in detail. In FIG. 10, for illustration and clarification purposes, the laser beam L is not illustrated in the section from the collimating optical systems 13a, 13b, and 13c to the light scanning device 21.

In this embodiment, one light diffuser 14 is provided, and this light diffuser 14 is formed by a micro-lens array. The optical guide unit 50 is arranged such that the laser beams L with mutually different wavelengths from the laser light sources 11a to 11c are guided to the light diffuser 14.

Specifically, the first optical guide member 51 having a dichroic mirror is disposed between one of the laser light sources, in the case of FIG. 10, the laser light source 11a, and the light diffuser 14. The second optical guide members 52 are arranged at the positions where the laser beams L from the other light sources, in the case of FIG. 10, the second laser light source 11b and the third laser light source 11c, are guided to the first optical guide member 51. More specifically, the first optical guide member 51 is disposed between the first collimating optical system 13a and the light diffuser 14. Also, the second optical guide members 52 are disposed at the positions where the laser beams L from the second collimating optical system 13b and the third collimating optical system 13c are guided to the first optical guide member 51. The first optical guide member 51 guides to the light diffuser 14 the laser beam L from the first laser light source 11a and the laser beams L from the second laser light source 11b and the third laser light source 11c via the second optical guide members 52.

As described above, the optical guide unit 50 guides to the light diffuser 14 the laser beams L having mutually different wavelengths emitted from the laser light sources 11a to 11c and passing through the beam expanders 12a to 12c and the collimating optical systems 13a to 13c.

In the present embodiment, the laser beams L from the laser light sources 11a to 11c are synthesized at a stage prior to the light diffuser 14. The controller 22 controls the timings of emitting the laser beams L from the laser light sources in cooperation with the scan control by the light scanning device 21.

Embodiment 4

Figure 11:
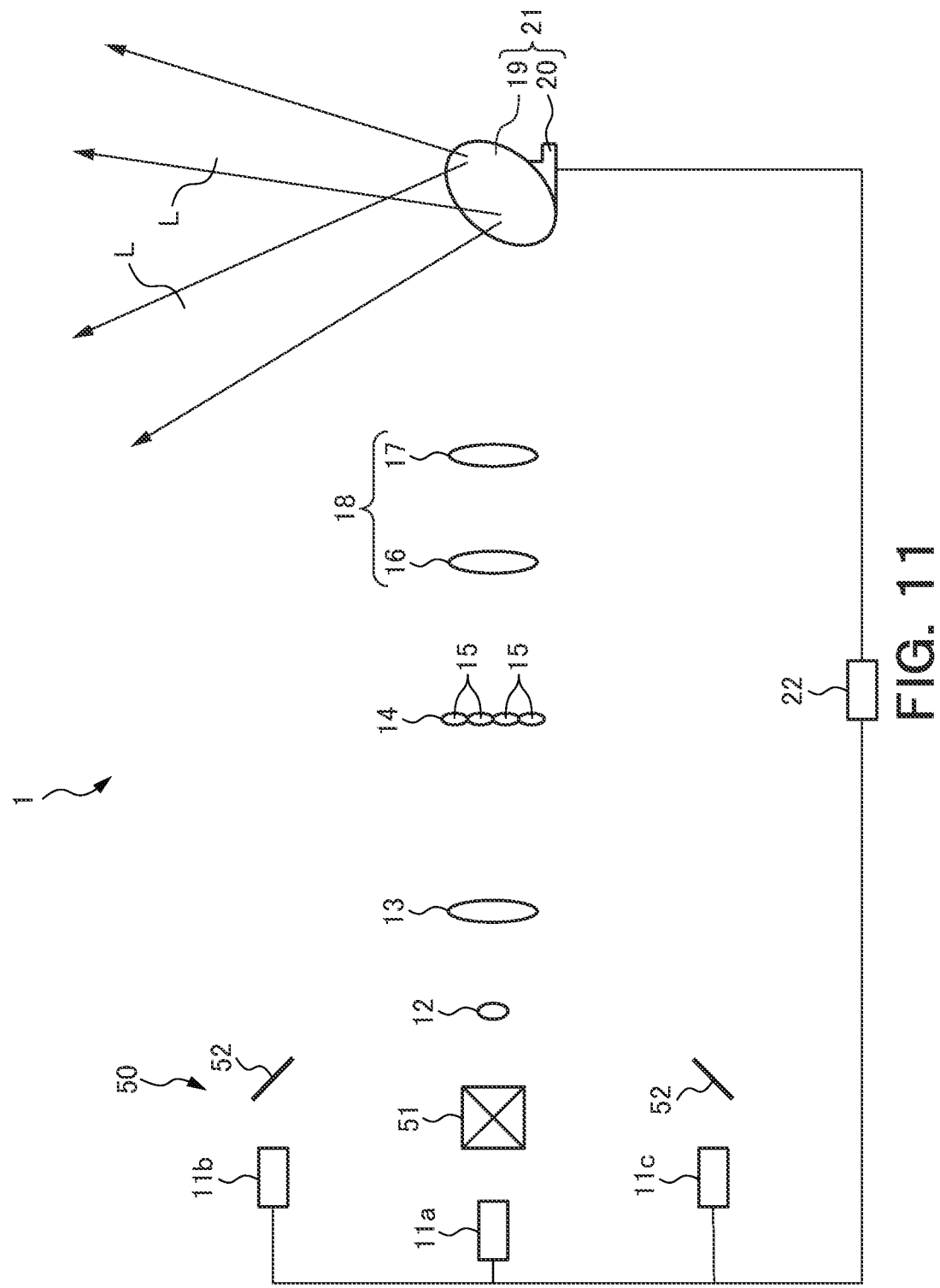
FIG. 11 is a conceptual diagram illustrating an outline of a structure of an illumination device according to Embodiment 4 of the invention.

FIG. 11 is a conceptual diagram illustrating an outline of a structure of an illumination device 1 according to Embodiment 4 of the invention. In this embodiment, the same reference characters are used to refer to elements that are the same as or similar to those used in Embodiment 3, and such elements will not be described further in detail. In FIG. 11, for illustration and clarification purposes, the laser beam L is not illustrated in the section from the laser light sources 11a, 11b, and 11c to the light scanning device 21.

In this embodiment, one beam expander 12 and one collimating optical system 13 are provided, and the optical guide unit 50 is placed at a stage prior to the beam expander 12. The first optical guide member 51 is disposed between the first laser light source 11a and the beam expander 12. The second optical guide members 52 are disposed at the positions where the laser beams L from the second laser light source 11b and the third laser light source 11c are guided to the first optical guide member 51. The first optical guide member 51 and the second optical guide members 52 synthesize the laser beams L from the laser light sources 11a to 11c at a stage prior to the beam expander 12. The synthesized laser beam L is emitted from the first optical guide member 51 to the beam expander 12.

As described above, the optical guide unit 50 emits the laser beams L of mutually different wavelengths emitted from the laser light sources 11a to 11c to the beam expander 12 and the collimating optical system 13, thereby guiding them to the light diffuser 14. The collimating optical system 13 is used to collimate the laser beams L of mutually different wavelengths from the laser light sources 11a to 11c. The controller 22 controls the timings of emitting the laser beams L from the laser light sources in cooperation with the scan control by the light scanning device 21.

Embodiment 5

Figure 12:
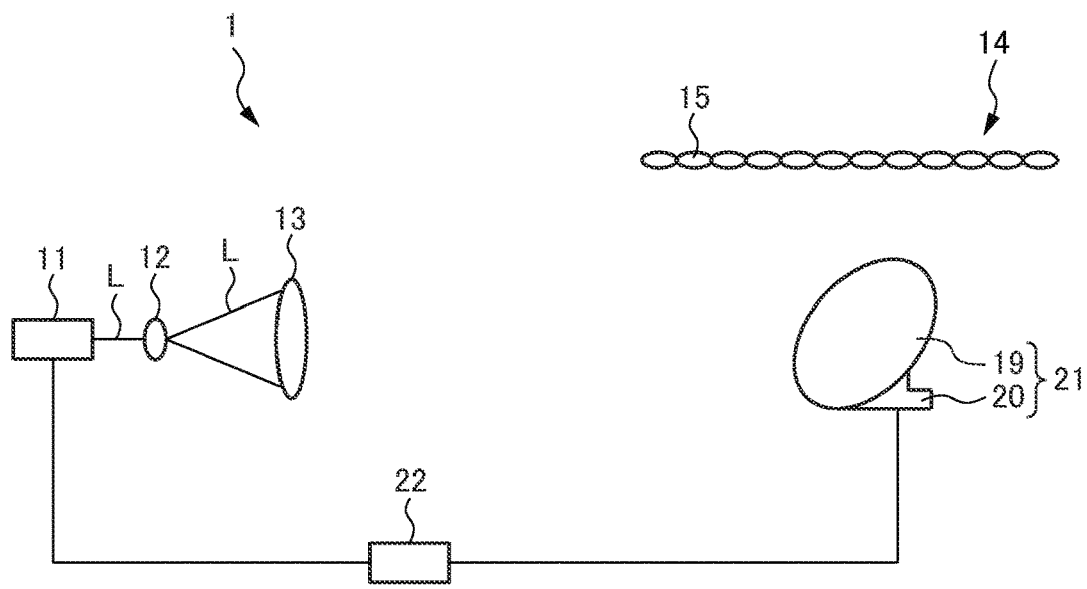
FIG. 12 is a conceptual diagram illustrating an outline of a structure of an illumination device according to Embodiment 5 of the invention.

FIG. 12 is a conceptual diagram illustrating an outline of a structure of an illumination device 1 according to Embodiment 5 of the invention. In this embodiment, the same reference characters are used to refer to elements that are the same as or similar to those used in Embodiment 1, and such elements will not be described further in detail. In FIG. 12, for illustration and clarification purposes, the laser beam L is illustrated only in the section between the laser light source 11 and the collimating optical system 13 and not illustrated in the other sections.

In this embodiment, the relay optical system 18 is removed, and the light diffuser 14 is provided between the light scanning device 21 and the illumination area 40. The light scanning device 21 is used to change the propagation direction of the laser beam L travelling from the laser light source 11 through the beam expander 12 and the collimating optical system 13, and the light diffuser 14 is used to diffuse the laser beam L from the light scanning device 21.

The laser beam L from the laser light source 11 is expanded in beam diameter by the beam expander 12 and the collimating optical system 13 and collimated before irradiating the light scanning device 21. The light scanning device 21 scans the laser beam L that has passed through the light diffuser 14 across the illumination area 40, thereby guiding the laser beam L to one of the illumination subareas 41 constituting part of the illumination area 40.

Embodiment 6

Figure 13:
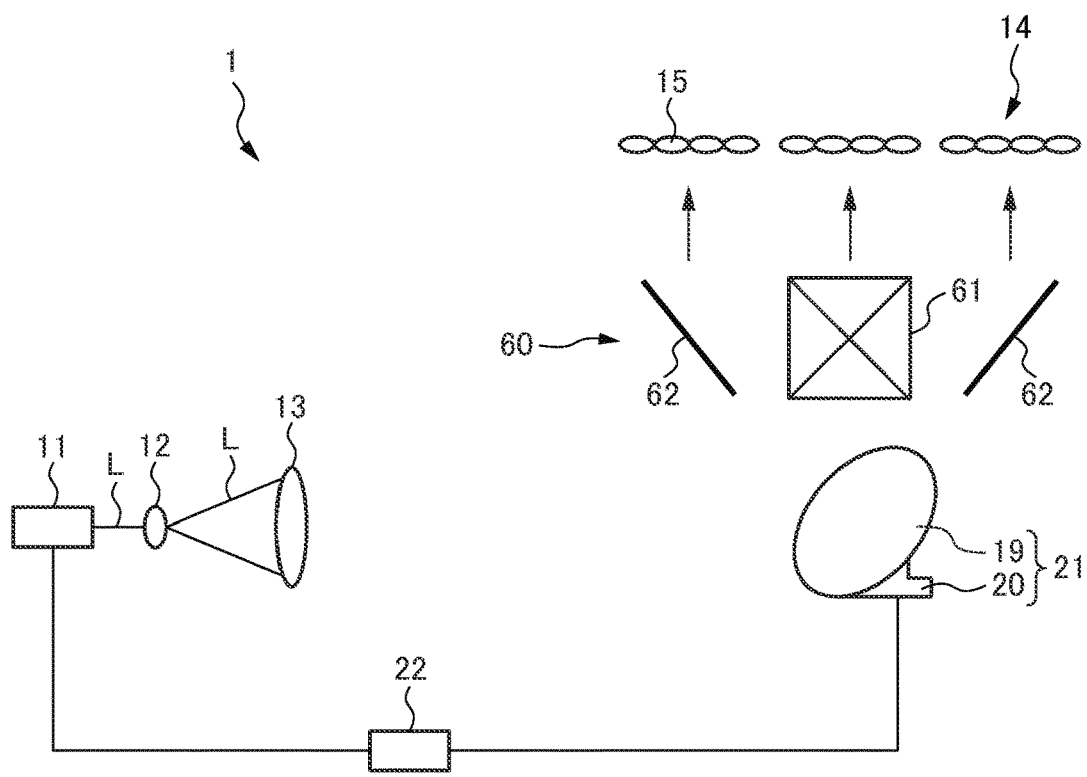
FIG. 13 is a conceptual diagram illustrating an outline of a structure of an illumination device according to Embodiment 6 of the invention.

FIG. 13 is a conceptual diagram illustrating an outline of a structure of an illumination device 1 according to Embodiment 6 of the invention. In this embodiment, the same reference characters are used to refer to elements that are the same as or similar to those used in Embodiment 5, and such elements will not be described further in detail. In FIG. 13, for illustration and clarification purposes, the laser beam L is illustrated only in the section between the laser light source 11 and the collimating optical system 13 and not illustrated in the other sections.

In this embodiment, the laser beam L emitted from the laser light source 11 and changed in direction by the light scanning device 21 includes multiple light components having mutually different wavelengths. A spectroscopic unit 60 is provided between the light scanning device 21 and the light diffuser 14. The laser beam L from the light scanning device 21 is incident on the light diffuser 14 via the spectroscopic unit 60. The spectroscopic unit 60 spectrally disperses the laser beam L incident on the spectroscopic unit 60 from the light scanning device 21 or separates the laser beam L into multiple light components having mutually different wavelengths, thereby emitting the light components toward the light diffuser 14.

The spectroscopic unit 60 of FIG. 13 includes a first spectroscopic guide member 61 and second spectroscopic guide members 62. The first spectroscopic guide member 61 has a dichroic mirror for letting a light component having a first wavelength range pass therethrough to guide the light component to the light diffuser 14 while reflecting the light components with the other wavelength ranges. The second optical guide members 62 guide to the light diffuser 14 the light components having the other wavelength ranges, reflected by the first spectroscopic guide member 61. The light components having different wavelengths guided by the first spectroscopic guide member 61 and the second spectroscopic guide members 62 are guided to different sections of the light diffuser 14 and incident on the associated light diffusers 14 each formed by a hologram. Each of the light components is diffused by the associated light diffuser 14 to illuminate one of the illumination subareas 41 within the illumination area 40.

For example, when the laser beam L emitted from the laser light source 11 includes light components having red-color, green-color, and blue-color wavelength ranges, the laser beam L incident on the spectroscopic unit 60 is separated into those components having respective wavelength ranges. The light component having the red-color wavelength range is guided by the spectroscopic unit 60 such that the light component is incident on the light diffuser 14 optimized for it. Similarly, the light components having the green-color and blue-color wavelength ranges are guided by the spectroscopic unit 60 such that they are incident on the light diffusers 14 optimized for them. In this embodiment as well, the controller 22 controls the timings of emitting the laser beams L from the laser light sources in cooperation with the scan control by the light scanning device 21.

<Other Modifications>

The invention is not limited to the foregoing embodiments and modifications, but allows other modifications.

For example, one or more elements selected from among the beam expander 12, the collimating optical system 13, and the relay optical system 18 can be removed, and the invention can also be applied to the illumination device 1 that does not include some of the elements of FIG. 1. For instance, when the relay optical system 18 is not provided, it is possible to place the irradiation surface 19 of the light scanning device 21 near the light diffuser 14, for example, at a position located away from the light diffuser 14 by the focal distance of the light diffuser 14 or near that position, and illuminate the illumination area 40 with the laser beam L. Also, a condenser lens can be provided on the upstream side of the light scanning device 21, or on the side of the laser light source, in addition to the relay optical system 18. Further, a condenser lens can also be provided on the downstream side of the light scanning device 21, or the side opposite the laser light source.

The application of the illumination device 1 is not particularly limited; for example, the illumination device 1 can be installed on a vehicle, a flying object such as an airplane, a train, a ship, a submarine, or other moving object. The illumination device 1 can also be placed at any particular position on those objects.

The invention is not limited to the foregoing embodiments, but allows various modifications that could be conceived by those skilled in the art. Further, the advantageous effects of the invention are not limited to those described above. In other words, some components can be added, modified, or partially removed without departing from the scope or concept of the invention defined in the appended claims or derived from its equivalents.

REFERENCE SIGNS LIST

1: Illumination device
11: Laser light source
12: Beam expander
13: Collimating optical system
14: Light diffuser
15: Diffusing element
16: First relay lens
17: Second relay lens
18: Relay optical system
19: Irradiation surface
20: Scan drive unit
21: Light scanning device
22: Controller
25: Light emission timing control unit
26: Optical scan control unit
31: Virtual micro-lens array
40: Illumination area
41: Illumination subarea
45: Reflective mirror
48: Optical fiber
50: Optical guide unit
51: First optical guide member
52: Second optical guide member
60: Spectroscopic unit
61: First spectroscopic guide member
62: Second spectroscopic guide member
L: Laser beam

The invention claimed is:

1. An illumination device comprising:
   a coherent light source which emits coherent light;
   a light scanning device which changes a propagation direction of the coherent light from the coherent light source; and
   a light diffuser which diffuses the coherent light from the light scanning device,
   wherein the light scanning device scans the coherent light having passed through the light diffuser in an illumination area so as to direct the coherent light to illumination subareas constituting parts of the illumination area,
   the coherent light which is changed in the propagation direction by the light scanning device has light components having mutually different wavelengths,
   a spectroscopic unit is provided between the light scanning device and the light diffuser,
   the coherent light from the light scanning device is incident on the light diffuser via the spectroscopic unit, and
   the spectroscopic unit splits the coherent light from the light scanning device to separate the coherent light into light components having mutually different wavelengths and emits the light components toward the light diffuser.

2. The illumination device as defined in claim 1, wherein the spectroscopic unit includes:
   a first optical guide which lets pass therethrough a light component having a first wavelength range to direct the light component to the light diffuser, while reflecting the light components having other wavelength ranges; and
   a second optical guide which directs the light components of the other wavelength ranges reflected by the first optical guide to the light diffuser.

* * * * *